July 1, 1958 W. R. KOCH 2,841,711

OSCILLATION GENERATOR

Filed Sept. 23, 1953

INVENTOR.
WINFIELD R. KOCH

BY

ATTORNEY

United States Patent Office 2,841,711

Patented July 1, 1958

2,841,711

OSCILLATION GENERATOR

Winfield R. Koch, Marlton, N. J., assignor to Radio Corporation of America, a corporation of Delaware Application September 23, 1953, Serial No. 381,902

7 Claims. (Cl. 250—36)

This invention relates to oscillation generators and more particularly relates to low power oscillators which are adapted to have a high frequency stability.

While not limited thereto, this invention is useful in the tunable local oscillators of various signal receivers of the superheterodyne type. Generally in such receivers, the local oscillator frequency is variable in unison with the tuning of the signal input circuits to cover a relatively wide range of frequencies.

As is well known there are certain factors which effect the frequency stability of oscillators such as, for example, as supply voltage variations, changing of tube and/or circuit parameters due to aging, temperature changes and the like. The resonant frequency of the oscillator circuit may be stabilized to a certain extent by isolating the resonant tank circuit insofar as possible from the above noted and other unstabilizing factors by loose coupling with the oscillator tube.

Electron tube oscillators generally depend upon the tube overload to limit the amplitude of the oscillations. Such a system permits relatively high voltages to be built up in the oscillator resonant tank circuit, particularly when the oscillator tube is loosely coupled to the tank circuit to secure the greater stability. This high tank circuit voltage causes an undesirable amount of oscillator radiation which may interfere with the receivers located in proximity thereto. With the increasing use of electronic equipment, it is important that receivers for home and commercial use have a minimum of oscillator radiation. This problem becomes increasingly important when it is economically unfeasible to provide an isolating stage of radio frequency amplification between the mixer and the antenna circuits.

Accordingly, it is a primary object of this invention to provide an improved frequency-stabilized electron tube oscillator which is characterized by relatively low oscillator radiation.

It is another object of this invention to provide an electron tube oscillator circuit in which a variation in tube parameters has a very small effect on the frequency of oscillation, and which has a very low amount of oscillator radiation.

In accordance with the invention, the oscillator radiation is reduced by limiting the amplitude of oscillations in the resonant tank circuit. The oscillator circuit comprises a tube which is connected across only a small part of the resonant tank circuit so that changes in the operational characteristics of the tube and tube circuits have a very small effect on the frequency of resonance of the tank circuit. A rectifier such as a crystal diode is subjected to a large part of the developed tank voltage for deriving a negative biasing potential which is delivered to the grid of the oscillator tube to reduce the transconductance of that tube. The reduced transconductance in turn reduces the feedback to the tank circuit thus limiting the strength of oscillations in the resonant tank circuit. Since the tendency of oscillator energy to radiate from the tank circuit is less with lower tank circuit voltages, there is less radiation from the circuit.

It is, therefore, a further object of this invention to provide an improved oscillator circuit for use with superheterodyne radio receiving systems and the like, which operates with low resonant tank circuit voltages to minimize oscillation radiation, and high frequency stability.

The novel features which are considered characteristic of this invention are set forth with particularity in the appended claims. The invention itself, however, both as to its organization and method of operation, together with further objects and advantages thereof, will best be understood by reference to the following description when taken in connection with the accompanying drawing, in which:

Figure 1:
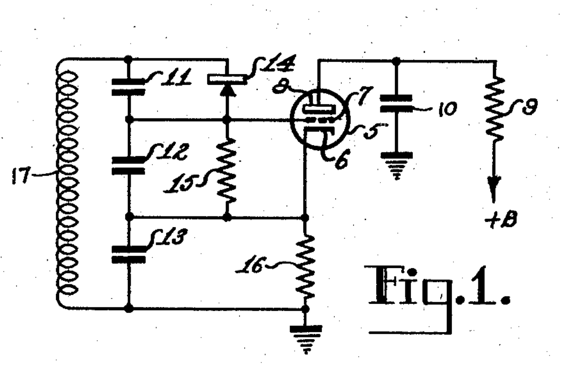
Figure 1 is a schematic circuit diagram of an improved oscillator circuit embodying the invention.

Referring first to Figure 1 an oscillator circuit of the Colpitts type, which is one of several alternative circuit types preferably employed in carrying out this invention. This circuit includes an electron discharge tube 5 having a cathode 6, a control grid 7, and an anode 8. A source of direct current polarizing potential (not shown) is connected with a terminal +B and conveyed therefrom to the anode 8. A resistor 9 provided between the anode 8 and the source of polarizing potential serves as a direct current limiting resistor. A capacitor 10 which has low impedance to oscillator frequencies is connected between the anode 8 and ground.

The resonant tank circuit of the oscillator comprises the parallel combination of an inductor 17 and three serially connected capacitors 11, 12, and 13. The relative values of the capacitors 11, 12, and 13 are such that the capacitor 11 has a much higher reactance than the combined reactances of the capacitors 12, 13. Thus the resonant frequency of the tank circuit depends chiefly upon the inductance of the inductor 17 and the capacitance of capacitor 11, and only a small amount on the capacitance of the capacitors 12 and 13.

The control grid 7 of the oscillator tube 5 is connected to the tank circuit at the junction of the capacitors 11 and 12, and the cathode 6 is connected at the junction of the capacitors 12 and 13. A grid resistor 15 interconnects the control grid 7 and the cathode 6 to provide a direct current path between the grid and cathode.

A rectifier 14 such as a 1N34A crystal diode is connected across the capacitor 11. A large part of the tank voltage is developed across the capacitor 11 due to its relatively large reactance, which voltage is rectified by the rectifier 14. The rectifier 14 is polarized so that the rectified current flowing through the resistor 15 develops a potential which renders the control grid 7 negative relative to the cathode. This bias voltage tends to bias the oscillator tube 5 toward cut off and hence, reduces the strength of the oscillations in the tank circuit. A crystal diode rectifier such as the rectifier 14 has much greater stability than electron tubes because it is not heated and it has a very small capacitance and the variations are, therefore, much smaller. The crystal rectifier is also more stable than a tube since the capacity thereof does not change like the input capacity of a tube which is a function of plate current.

A cathode bias resistor 16 which has a rather high value of resistance is connected between the cathode 6 of the oscillator tube 5 and ground so that the oscillator is stabilized against any motorboating or blocking which might be caused by the negative bias voltage derived from the tank circuit.

The tube and accompanying circuits are effectively connected in parallel with the capacitors 12 and 13. Since the capacitors 12 and 13 have only a small effect on the frequency of the oscillator tank circuit, changes in the tube operational characteristics and the like affect the frequency of the resonant tank circuit only slightly. Furthermore, the transconductance of the oscillator tube is limited in accordance to the strength of the oscillations in the tank circuit so that the tank circuit voltages are maintained at a predetermined low level to reduce radiation.

Figure 2:
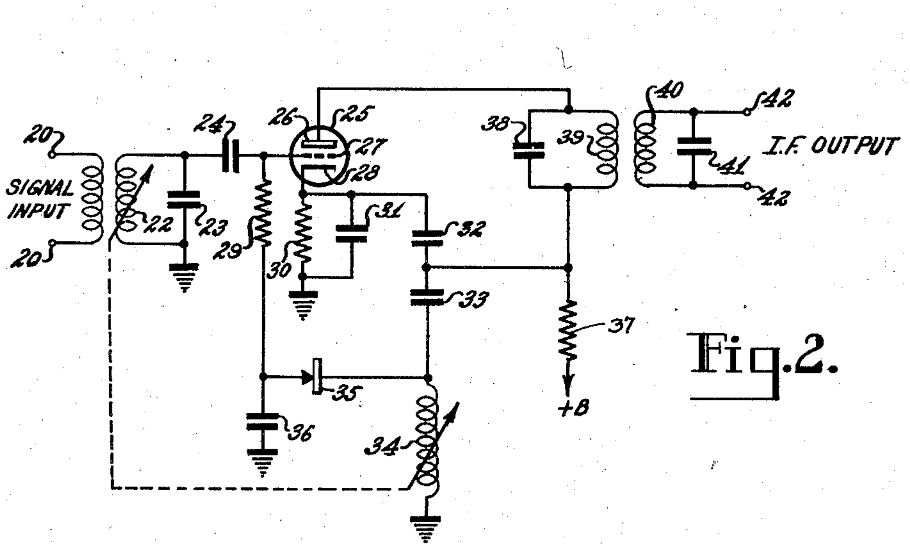
Figure 2 is a schematic circuit diagram of a frequency conversion circuit having an oscillator portion which is a modification of the circuit of Figure 1 and illustrates a further embodiment of the invention.

The circuit diagram of Figure 2 shows a frequency converting system for converting the frequency of a received signal to that of an intermediate frequency by heterodyning the received signal with a local oscillator signal. A pair of signal input terminals 20 are connected to a source of radio frequency signals (not shown). The radio frequency signals are conveyed from the terminals 20 to a primary winding 21 and are coupled therefrom to a secondary winding 22 of the radio frequency transformer. A capacitor 23 is connected in parallel with the secondary winding 22 and forms a tuned circuit resonant at the frequency of the radio frequency signals to be received. The inductance portion of the signal selection circuit provides the variable tuning element so that the circuit may be tuned over the band of frequencies to be received. The radio frequency signal is coupled from the tunable resonant circuit through a coupling capacitor 24 to the signal input circuit of a converter tube 25 which has an anode 26, a control grid 27 and a cathode 28.

The resonant tank circuit of the converter oscillator section which is connected between the plate 26 and the cathode 28 of the converter tube is comprised of three serially connected capacitors 31, 32, and 33 which are connected in parallel with an inductor 34. The inductor 34 is shown as the variable frequency determining element of the resonant tank circuit and is ganged for simultaneous movement and tuning with the tuning element of the inductor 22 in the radio frequency signal selection circuit.

The tank circuit is connected from the junction of the capacitors 31 and 32 to the cathode 28 of the converter tube, and from the junction of capacitors 32 and 33 through a resonant circuit to the anode 26 of the converter tube.

The size of the capacitors 31, 32, 33 are selected so that the resonant frequency of the circuit depends primarily on the values of the inductor 34 and the capacitor 33, and only a small amount on the capacitors 31 and 32. The converter circuit and tube capacitances and the like which are effectively connected in parallel with the capacitor 32 also have very little effect on the resonant frequency of the tank circuit.

A crystal rectifier 35 and a capacitor 36 are serially connected from the high potential side of the oscillator resonant circuit to ground, and are effectively connected in parallel with the tuning inductor 34. The back resistance of the crystal rectifier 35 provides an adequate discharge path for the capacitor 36, however, if a vacuum tube rectifier is used a resistor of appropriate size may be connected across the capacitor 36 to provide a proper discharge path. The rectifier 35 is connected so that when the tank circuit voltage causes the rectifier to conduct, a negative potential with respect to ground is developed across the capacitor 36. This negative potential is connected to the control grid 27 through a grid return resistor 29 which is connected from the control grid 27 to the junction of the rectifier 35 and capacitor 36. The negative potential on the control grid 27 tends to reduce the transconductance of converter tube 25 and thus keep down the strength of the oscillations in the tank circuit so that the accompanying radiation and interference may be reduced. Since the negative bias thus developed may be sufficient to cut off the converter tube, a cathode bias resistor 30 which has a relatively high resistance is connected between the cathode 28 and ground to prevent the oscillator from motorboating or blocking.

The anode 26 of the converter tube 25 is connected to a resonant circuit comprised of the capacitor 38 and the inductor 39 which are tuned to the intermediate frequency to derive the intermediate frequency signal resulting from the heterodyning of the radio frequency signal and the local oscillator signal in the converter tube. A current limiting resistor 37 is provided between the resonant circuit and a source of polarizing potential +B for the converter tube. The intermediate frequency signal developed across the capacitor 38 and the inductor 39 which comprise the primary winding of an intermediate transformer, is coupled to a secondary winding 40. The secondary winding 40 is also tuned to the intermediate frequency by a capacitor 41. The intermediate frequency energy developed in the secondary circuit appears across a pair of terminals 42, and may be connected to a utilization device such as further intermediate frequency stages of amplification.

Figure 3:
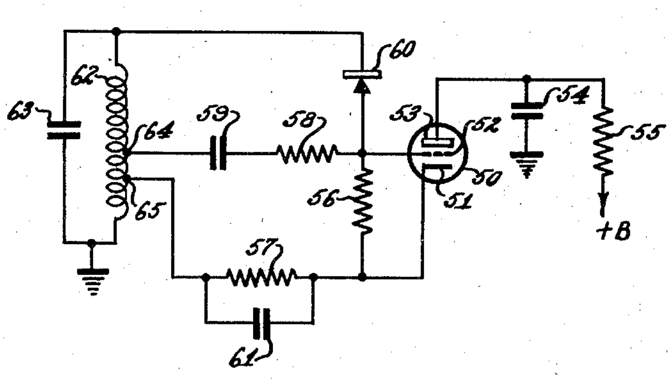
Figure 3 is a schematic circuit diagram of a further oscillator circuit, also in accordance with the invention.

The circuit arrangement of Figure 3 is substantially that of a Hartley oscillator. This circuit includes an electron discharge tube 50 which may be the same as the tube shown in Figure 1, and has an anode 53, a grid 52, and a cathode 51. The principal difference between the Hartley oscillator and the Colpitts oscillator as is well known, resides in the use of the Hartley oscillator of a tapped inductance in place of series capacitance for deriving a suitable phased feedback potential.

The resonant tank circuit for the oscillator tube 50 which is connected between the control grid 52 and the cathode 51 comprises a capacitor 63 and an inductor 62 which are connected in parallel relation. The inductor 62 is provided with a pair of tapping points 64 and 65.

The tapping point 64 is connected through the coupling capacitor 59 and a parasitic suppressing resistor 58 to the control grid of the oscillator tube 50. The tapping point 65 is connected through a cathode biasing resistor 57 to the cathode 51 of the oscillator tube 50.

A bypass capacitor 61 which provides a low impedance path for signals at oscillator frequency is connected in shunt with the cathode biasing resistor 57.

The portion of the inductor 62 between the terminals 64 and 65 is small in comparison with the total inductance of the inductor 62 and, therefore, this portion has only a small effect on the resonant frequency of the tank circuit. As can be seen, the grid-cathode capacitance and the like of the oscillator tube 50 are shunted across the portions of the inductor 62 which is connected between the tapping points 64 and 65. Since this portion of inductance tapped by tapping points 64 and 65 has only a very small effect on the resonant frequency of the tank circuit, changes in interelectrode capacitance and other changes of the oscillator 50 and accompanying circuits will produce very little effect on the oscillator frequency on the oscillator circuit.

A rectifier 60 is connected from the high potential side of the resonant tank circuit to the control grid 52 of the oscillator tube. Current flow in the rectifier 60 in response to tank circuit oscillations flows through a grid return resistor 56 which is connected between the control grid 52 and cathode 51 of the oscillator tube 50. The rectifier 60 is polarized so that the current flow is in a direction to develop a potential across the grid resistor 56 that will drive the control grid 52 negative with respect to the cathode 52.

The anode 53 of the oscillator is connected through a direct current dropping resistor 55 to a source of polarizing potential +B. A capacitor 54 is connected from the anode 50 to a point of fixed reference potential or ground and has an impedance which is very low to signals of the oscillator frequency.

It is recognized that the principles of the invention can be applied to a semi-conductor amplifier oscillator. By properly connecting the semi-conductor and accompanying circuits across a relatively small portion of the tank circuit, and deriving a biasing potential from a relatively larger portion of the tank voltage to reduce the transconductance thereof as set forth hereinbefore a low power stabilized transistor oscillator can be provided.

From the foregoing description, it will be seen that in a system of the type described above, through proper application of the principles underlying the invention, a low power frequency stabilized oscillator for use with superheterodyne receivers and having reduced oscillator radiation may be provided.

What is claimed is:

1. An oscillation generator comprising an amplification device having at least three electrodes, a tank circuit for said oscillation generator having inductance and capacity for determining the frequency of oscillations generated, means for connecting at least two of the electrodes of said amplifying device across a relatively small portion of said tank circuit whereby changes in the operational characteristics of said device have a very small effect on the frequency of resonance of said tank circuit, means providing connections between the electrodes of said amplification device whereby oscillations are regeneratively set up at a frequency determined by the resonant characteristics of said tank circuit, means for deriving a negative control potential in response to oscillations in said tank circuit, and means for applying said negative potential to the amplifying device for controlling the amplitude of oscillations of said generator.

2. An electron tube oscillator comprising an electron tube having at least an anode, a cathode and a control grid, a resonant tank circuit for said oscillator having inductance and capacitance for determining the frequency of oscillations generated, means for connecting at least two of said electrodes of said tube across a relatively small portion of said tank circuit whereby changes in the operational characteristics of said device have only a very small effect on the frequency of resonance of said tank circuit, means providing connections between the electrodes of said tube whereby oscillations are regeneratively set up at a frequency determined by the resonant characteristics of said tank circuit, an oscillation amplitude control circuit for said oscillator including a rectifier, means connecting said control circuit across a relatively large portion of said tank circuit, said control circuit responsive to oscillations in said tank circuit for deriving a negative control potential, means for applying said negative control potential to the control grid of said electron tube for controlling the amplitude of oscillations of said oscillator, and a cathode bias resistor having a large value of resistance connected in series with said cathode to stabilize the oscillator against blocking.

3. An electron tube oscillator comprising an electron tube having at least an anode, a cathode, and a control grid, a resonant tank circuit having an inductor and first and second serially connected capacitors for determining the frequency of oscillations generated, said first capacitor having a relatively high reactance relative to said second capacitor at the oscillator frequency, means for connecting two of said electrodes of said tube across the terminals of said second capacitor, means providing connection between said anode, cathode and control grid whereby oscillations are regeneratively set up at a frequency determined by the resonant characteristics of said tank circuit, an oscillator amplitude control circuit for said amplifier including a rectifier connected in series with a resistor, means for connecting said rectifier across the terminals of said first capacitor and for connecting said resistor between said control grid and said cathode, said rectifier being connected so that current flowing through said rectifier and resistor in response to oscillations in said tank circuit, produces a negative potential on the control grid with respect to said cathode for controlling the amplitude of the generated oscillations, a resistor having a large value of resistance connected in series with said cathode for stabilizing the oscillator against blocking due to said negative potentials.

4. In a superheterodyne receiving system adaped to receive selected radio frequency signals, the combination with means for intercepting the radio frequency signals of a frequency conversion circuit comprising an electron tube having at least an anode, a cathode and a control grid, means connecting said intercepted radio frequency signals with said control grid, means for generating a heterodyning oscillator signal having a predetermined frequency with respect to the frequency of said received radio frequency signals including a resonant tank circuit having inductance and capacitance for determining the frequency of oscillations generated, means for connecting at least two of said electrodes of said tube across a relatively small portion of said tank circuit, means providing connections between the electrodes of said tube whereby oscillations are regeneratively set up at a frequency determined by the resonant characteristics of said tank circuit, an oscillation amplitude control circuit for said oscillation generating means including a rectifier, means connecting said control circuit across a relatively large portion of said tank circuit, said control circuit responsive to oscillations in said tank circuit for deriving a negative control potential, means for applying said negative potential to the control grid of said electron tube for controlling the amplitude of the generated oscillations, means including a resonant circuit tuned to the intermediate frequency for deriving an intermediate frequency potential connected with the anode of said tube, and utilization means connected with said last named means.

5. An electron tube oscillator generator comprising an electron tube having at least an anode, a cathode and a control electrode, a tank circuit having an inductor and a capacitor for determining the frequency of oscillations generated, said inductor having a pair of tapping points defining an inductive portion therebetween which is small relative to the total inductance of said inductor, means for connecting two of the electrodes of said tube respectively to said tapping points, means providing connections between said three electrodes whereby oscillations are regeneratively set up at a frequency determined by the resonant characteristics of said tank circuit, a serially connected rectifier and resistor connected in parallel with a relatively large portion of said inductance, said resistor being connected between said control electrode and said cathode, said rectifier connected so that current flowing through said rectifier and said resistor in response to oscillations in said tank circuit render said control electrode at a negative potential relative to said cathode for controlling the amplitude of the generated oscillations, a resistor having a high resistance value connected in series with said cathode for stabilizing said oscillator against blocking due to said negative control electrode potential.

6. An electron tube oscillator comprising an electron tube having at least an anode, a cathode, and a control grid, a resonant tank circuit having a first, second and third serially connected capacitors and an inductor connected in parallel with said serially connected capacitors, said first capacitor comprising a frequency determining capacitance for substantially determining the frequency of resonance of said tank circuit, means for connecting two of said electrodes of said tube across the terminals of said second capacitor, means connecting said anode to said cathode through said third capacitor whereby oscillations are regeneratively set up at a frequency determined by the resonant characteristics of said tank circuit, an oscillator amplitude control circuit for said amplifier including a rectifier connecetd in series with a resistor, means connecting said rectifier across the terminals of said first capacitor and further means connecting said resistor between said control grid and said cathode, said rectifier being poled so that a negative potential is provided on the control grid with respect to the cathode for controlling the amplitude of the generated oscillations in response to current flowing through said rectifier and resistor in response to oscillations in said tank circuit, and a resistor having a large value of resistance connected in series with said cathode for stabilizing the oscillator against locking due to said negative potentials.

7. An oscillation generator comprising an amplification device having at least three electrodes, a tank circuit for said oscillation generator having inductive and capacitive reactive paths for determining the frequency of oscillations generated, a first portion of one of said reactive paths substantially comprising the frequency determining reactance for tuning the other reactive path to a predetermined resonant frequency, means connecting at least two of the electrodes of said amplifying device across a second portion of said one of said reactive paths whereby changes in the operational characteristics of said device have a very small effect on the frequency of resonance of said tank circuit, means providing connections between the electrodes of said amplification device and said tank circuit whereby oscillations are regeneratively set up at a frequency determined by the resonant characteristics of said tank circuit, means for deriving a negative control potential in response to oscillations in said tank circuit, and means for applying said negative potential to the amplifying device for controlling the amplitude of oscillations of said generator.

References Cited in the file of this patent

UNITED STATES PATENTS

| | | |
|---|---|---|
| 2,343,539 | Edson | Mar. 7, 1944 |
| 2,424,905 | Scheldorf | July 29, 1947 |
| 2,508,048 | Sziklai | May 16, 1950 |
| 2,628,314 | Bussard | Feb. 10, 1953 |
| 2,706,249 | Vackar | Apr. 12, 1955 |

FOREIGN PATENTS

| | | |
|---|---|---|
| 519,672 | Great Britain | Apr. 3, 1940 |

OTHER REFERENCES

Article: "An Inductance-Capacitance Oscillator of Unusual Frequency Stability," by Clapp, reprinted from the PIRE for March 1948.

Article: "Pseudosynchronization In Amplitude Stabilized Oscillators," by Agrain et al.; reprinted from PIRE for June 1948.